United States Patent [19]

Myers et al.

[11] Patent Number: 4,689,723

[45] Date of Patent: Aug. 25, 1987

[54] HERMAPHRODITIC SHIELD FOR LINE TERMINATOR

[75] Inventors: Earl C. Myers, Harrisburg; Michael E. Shirk, Grantsville; Mark H. Waters, Harrisburg, all of Pa.

[73] Assignee: AMP Incorporated, Harrisburg, Pa.

[21] Appl. No.: 913,182

[22] Filed: Sep. 29, 1986

[51] Int. Cl.[4] .................................. H05K 9/00

[52] U.S. Cl. .................................. 361/424; 439/607

[58] Field of Search .................... 361/424; 339/143 R, 339/19, 222; 333/22 R; 174/35 C

[56] References Cited

U.S. PATENT DOCUMENTS 4,453,798 6/1984 Asick et al. .................... 339/143 R 4,557,919 3/1986 Waters .......................... 339/59 M 4,585,292 4/1986 Frantz et al. .................. 339/143 R

*Primary Examiner*—A. D. Pellinen

*Assistant Examiner*—Morris Ginsburg

*Attorney, Agent, or Firm*—David L. Smith

[57] ABSTRACT

A shielded line terminator having a pair of electrically conductive, hermaphroditic shields each having hooked tines which engage profiled recesses along an edge of an electrically conductive shell of an electrical connector. The shields form a rearward extending cavity encompassing a line terminator which engages contacts extending from the rear face of the electrical connector. Each shield has latch means positioned to engage lug means on the other shield to detachably secure the shields together.

16 Claims, 3 Drawing Figures

HERMAPHRODITIC SHIELD FOR LINE TERMINATOR

BACKGROUND OF THE INVENTION

This invention relates to line termination and in particular to a line terminator comprised of an electrical connector having a pair of electrically conductive hermaphroditic shields encompassing the line terminator.

Networks or busses on which a plurality of microprocessors communicate are terminated in the characteristic impedance of the network. The network is typically a cable with the mode of termination dictated by the mode of communication on the network. The characteristic impedance or line terminator can be made an integral part of an electrical connector for engaging a complimentary connector which is connected to the network. To prevent electromagnetic interference from inducing spurious signals in the line terminator, the line terminator must be shielded with the shield grounded to a ground common to the network.

U.S. Pat. No. 4,585,292 discloses a two-piece shield for an electrical connector having a cable attached thereto in which the shield can withstand the pressure generated in an overmolding operation wherein the shield is encased in an insulative layer. Each part of the two-part shield has hooked tines that engage profiled recesses along an edge of an electrically conductive shell of the electrical connector. The two-part shield encompasses the rear face of the electrical connector where the line terminator circuit resides.

While many forms of shielding have proven to be satisfactory, it would be desirable to have a shield for a line terminator for use with an electrical connector that is effective in shielding, removable and easy to install. Such a removable shield would provide access to the line terminator for service.

SUMMARY OF THE INVENTION

In accordance with the present invention, a pair of hermaphroditic metal shields have hooked tines which engage profiled recesses along an edge of an electrically conductive shell of an electrical connector. The shields form a rearward extending cavity encompassing a line terminator which engages contacts extending from the rear face of the electrical connector. Each metal shield has latch means positioned to engage lug means on the other shield to detachably secure the shields together.

DESCRIPTION OF THE PREFERRED EMBODIMENT

Figure 1:
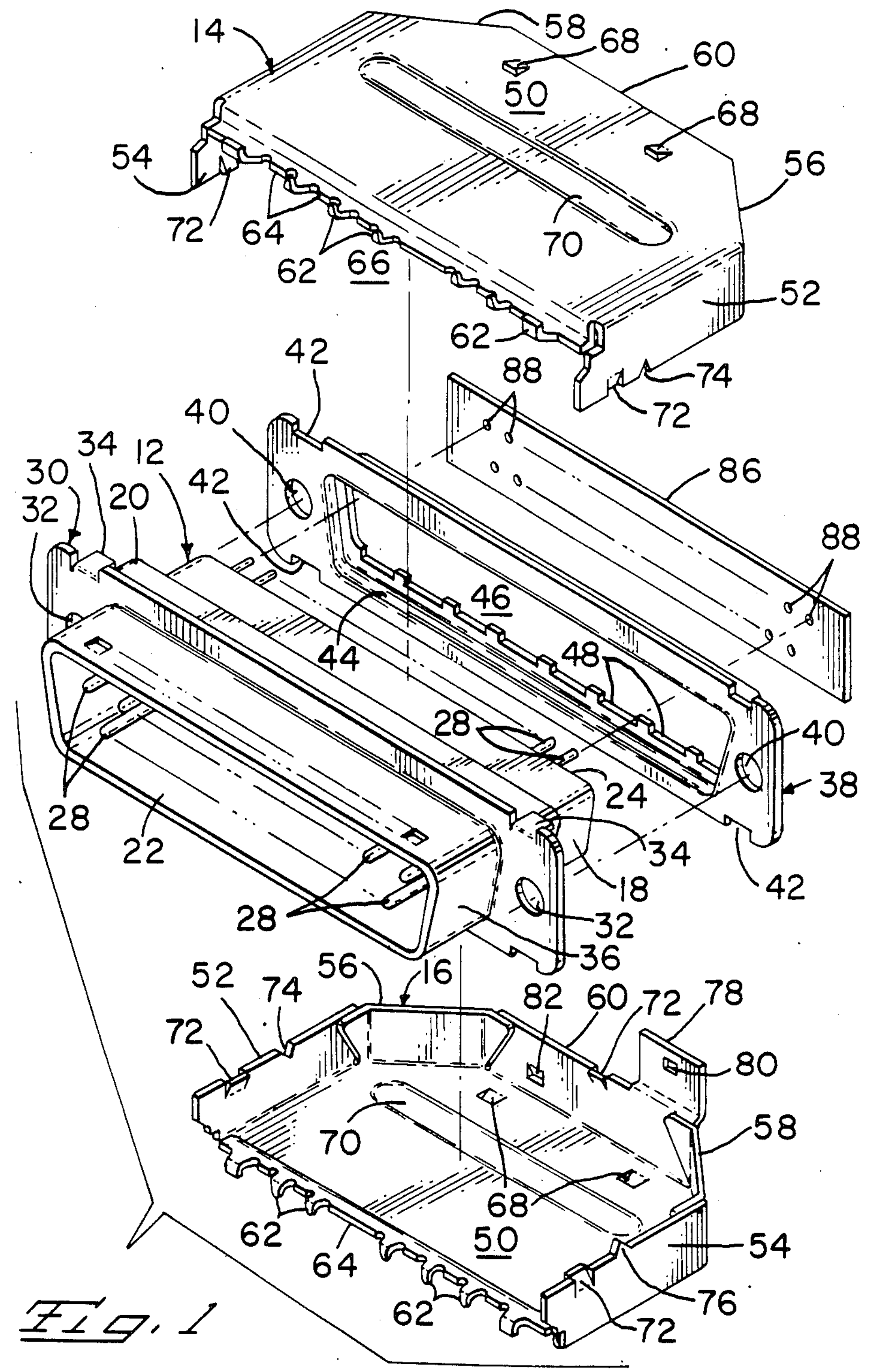
FIG. 1 is an exploded perspective view of a shielded line terminator in accordance with the present invention together with a known electrical connector.

Referring to the Drawings, initially to FIG. 1, there is depicted therein a shielded line terminator in accordance with the present invention. Shielded line terminator 10 is comprised of an electrical connector 12, circuit board 86 and a pair of electrically conductive shields 14, 16. The connector 12 shown is exemplary and is one of a well known type, namely a subminiature D connector of the type manufactured by the assignee, AMP, Incorporated, and sold under the trademark AMPLIMITE.

Connector 12 has insulative housing 18 molded of thermoplastic with integral peripheral flange 20, a mating face 22, an opposed rear face 24 and a plurality of contact receiving passages 26 extending therebetween having contacts 28 (FIG. 3) secured therein. Front shell 30 has mounting apertures 32 at opposite ends thereof for securing a complementary connector thereto, gripping lugs 34 and is received against the front surface of flange 20. Integral shroud 36 encloses the forward portion of housing 18.

Rear shell 38 has a similar outer profile with mounting apertures 40 aligned with apertures 32 and recesses 42 aligned to receive respective lugs 34. Rear shell 38 is profiled to define cavity 44 which receives a portion of housing 18 of connector 12. Rear shell 38 also has central opening 46 with a plurality of recesses 48 along the marginal edges thereof.

Each shield 14, 16 is a stamped and formed metal member having a generally planar wall 50 surrounded by depending side walls 52, 54, angled side walls 56, 58 and end wall 60. Planar wall 50 has hooked gripping tines 62 along the forward edge therof that engage recesses 48 in opening 46 to make electrical contact between shields 14, 16 and rear shell 38 and to releasably secure shields 14, 16 to rear shell 38. Between tines 62 are intervening forwardly directed lances 64 which engage the rear surface of rear shell 38 by means of an interference fit further assuring electrical continuity therebetween as shields 14, 16 are rotated about tines 62 into engagement forming cavity 66 encompassing the rear end of housing 18.

Planar wall 50 may have gripping means 68, directed outwardly from cavity 66, stamped therein. For strength, planar wall 50 may have transverse embossment 70.

Stamped offsets 72 are provided on sidewalls 52 and 54 as well as on end wall 60 to provide a greater bearing surface. As shields 14 and 16 are rotated about tines 62 and side wall 54, angled side wall 58, end wall 60, angled sidewall 56 and sidewall 52 of shield 14, respectively, engage sidewall 52 angled sidewall 56, endwall 60, angled side wall 58 and sidewall 54 of shield 16, the greater bearing surface prevents one shield from slipping down over the other shield.

Side wall 52 has recessed alignment section 74; sidewall 54 has complementary alignment member 76. Alignment section 74 and member 76 aid in the relative positioning of shields 14 and 16 as shields 14 and 16 are rotated about tines 62 to form cavity 66. Recessed alignment section 74 and complementary alignment member 76 confine movement of shields 14 and 16 normal to wall 50 when shields 14 and 16 are latched together. This prevents latch 78 and lug 82 from becoming disengaged and maintains the electrical connection between rear shell 38 and shields 14 and 16. In a preferred embodiment, recessed alignment section 74 is a "V" shaped notch and complementary alignment member 76 as a "V" shaped protrusion.

Shields 14 and 16 have means for detachably securing the shields together. Latch 78 is an extension of a portion of end wall 60 extending away from planar wall 50 and is offset from the plane of end wall 60 by the thickness thereof. Aperture 80 is positioned in latch 78 to engage outwardly-directed lug 82 on end wall 60 of the other shield. In a preferred embodiment, shields 14 and 16 are hermaphroditically configured.

Figure 2:
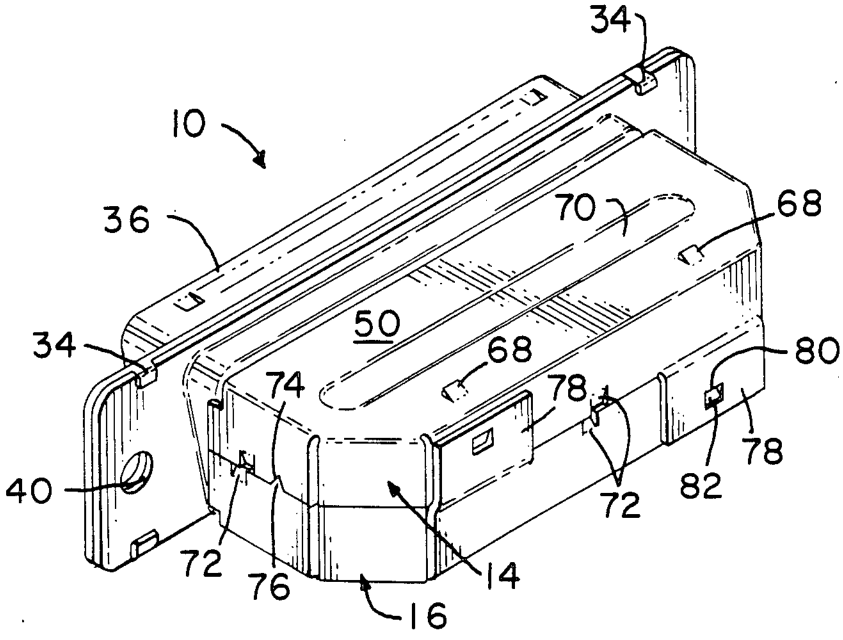
FIG. 2 is a rear perspective view of the shielded line terminator of FIG. 1 assembled.

A impedance matching termination is accomplished by a circuit on circuit board 86. The termination may be by any known technique including voltage mode, current mode or small computer system interface. The impedance matching circuit can be manufactured on a circuit board 86 having apertures 88 to receive contacts 28 of connector 12 for soldering directly thereto. As best seen in FIG. 2, with shielded line terminator 10 assembled, shields 14, 16 encompass the rear of housing 18 and shield circuit board 86.

Figure 3:
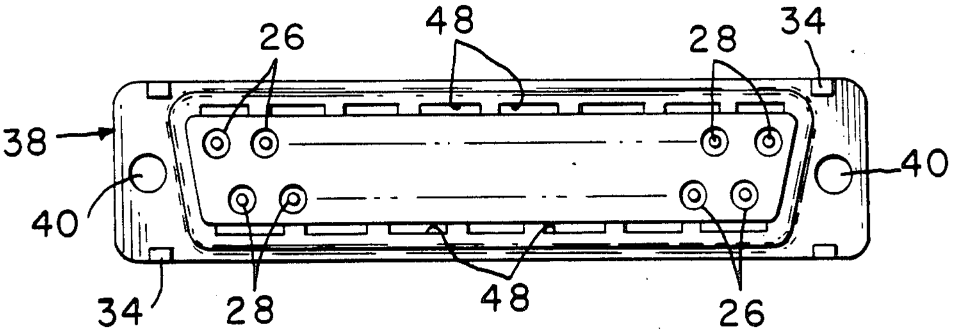
FIG. 3 is a rear view of the line terminator with the shield and circuit board removed.

As best seen FIG. 3, recesses 48 in the upper marginal edge of opening 46 differ in length and spacing from recesses 48 in the lower marginal edge of opening 46. Tines 62 on shields 14, 16 are spaced to accommodate the spacing of recesses 48 on both marginal edges of opening 46.

A shielded line terminator has been disclosed which includes a pair of hermaphroditic shields encompassing a line terminator. The shields are electrically conductive and have hooked tines which engage profiled recesses along an edge of an aperture in an electrically conductive shell of an electrical connector. The shields form a rearward extending cavity encompassing a line terminator which engages contacts extending from the rear face of the electrical connector. Each shield has alignment features to aid in the relative positioning of the shields and latch means positioned to engage lug means on the other shield to detachably secure the shields together.

We claim:

1. A shielded line terminator comprising:

an insulative housing having a front mating face, a rear face and contact receiving passages extending therebetween with contacts secured therein;

metal shell means mounted on the periphery of said housing between said faces, said shell means having an aperture therethrough;

a line terminator engaging the contacts proximate the rear face of the housing; and a pair of stamped and formed metal shields having hooked tines which engage the aperture in said shell as said shields are rotated about said tines into engagement in opposition to each other forming a rearward extending cavity encompassing the rear face of the housing and the line terminator.

2. A shielded line terminator as recited in claim 1 wherein the shields are hermaphroditically configured.

3. A shielded line terminator as recited in claim 1 wherein said aperture is profiled with recesses along an edge thereof, said tines engaging said recesses.

4. A shielded line terminator as recited in claim 1 wherein the shields further comprise a stamped offset that provides a greater bearing surface as the shields engage.

5. A shielded line terminator as recited in claim 1 wherein the line terminator is a voltage mode terminator.

6. A shielded line terminator as recited in claim 1 wherein the line terminator is a current mode terminator.

7. A shielded line terminator as recited in claim 1 wherein the line terminator is a small computer system interface.

8. A shielded line terminator as recited in claim 1 wherein the shields further comprise alignment means for aiding in positioning the shields as they are rotated about the tines into engagement.

9. A shielded line terminator as recited in claim 8 wherein the alignment means are complementary.

10. A shielded line terminator as recited in claim 9 wherein the alignment means on one of said shields is a "V" shaped notch and the alignment means on the other of said shields is a "V" shaped protrusion.

11. A shielded line terminator as recited in claim 10 wherein the shields are hermaphroditically configured.

12. A shielded line terminator as recited in claim 1 further comprising at least one shield having a lance thereon which engages the shell means thereby providing electrical continuity therebetween.

13. A shielded line terminator as recited in claim 12 wherein the lance is disposed between adjacent tines.

14. A shielded line terminator as recited in claim 1 wherein each of the pair of shields further comprises means for detachably securing said shields together.

15. A shielded line terminator as recited in claim 14 wherein the means for detachably securing said shields together comprises latching means on one said shield positioned to engage lug means on the other said shield.

16. A shielded line terminator as recited in claim 15 wherein the shields are hermaphroditically configured.

* * * * *